United States Patent [19]

Kohdaka

[11] Patent Number: 4,951,054
[45] Date of Patent: Aug. 21, 1990

[54] FLOATING-POINT DIGITAL-TO-ANALOG CONVERTING SYSTEM

[75] Inventor: Takayuki Kohdaka, Hamamatsu, Japan

[73] Assignee: Yamaha Corporation, Hamamatsu, Japan

[21] Appl. No.: 311,059

[22] Filed: Feb. 16, 1989

[30] Foreign Application Priority Data

Feb. 17, 1988 [JP] Japan .................................. 63-34903

[51] Int. Cl.$^5$ .............................................. H03M 1/70
[52] U.S. Cl. ...................................... 341/138; 341/144
[58] Field of Search ............... 341/138, 139, 153, 154, 341/144, 131

[56] References Cited

U.S. PATENT DOCUMENTS

| | | | |
|---|---|---|---|
| 4,177,457 | 12/1979 | Howlett | 341/138 |
| 4,240,070 | 12/1980 | Helbig et al. | 341/139 |
| 4,250,492 | 2/1981 | Yamakido et al. | 341/127 |
| 4,727,355 | 2/1988 | Kohdaka et al. | 341/154 |

Primary Examiner—William M. Shoop, Jr.
Assistant Examiner—H. L. Williams
Attorney, Agent, or Firm—Burns, Doane, Swecker & Mathis

[57] ABSTRACT

A floating-point digital-to-analog converting system which includes a mantissa digital-to-analog converter (DAC) and an exponent DAC. Normally, the mantissa DAC has a digital-to-analog converting accuracy higher than that of the exponent DAC because of differences in their construction. Hence, as long as the accuracy of the mantissa DAC is greater than that of the exponent DAC, an analog mantissa output from the mantissa DAC is used as an analog output of the present system. On other other hand, once the accuracy of the mantissa DAC goes below that of the exponent DAC, data obtained by shifting digital input data is applied to the mantissa DAC. Then, the exponent DAC multiplies the analog mantissa by a weight corresponding to the digital exponent data included in the digital input data. Thus, an analog output is obtained from the exponent DAC.

3 Claims, 4 Drawing Sheets

FIG. 2

FLOATING-POINT DIGITAL-TO-ANALOG CONVERTING SYSTEM

BACKGROUND OF THE INVENTION

1. Field of the Invention

The invention relates generally to a floating-point digital-to-analog converting system (called DAC hereafter), and more specifically to a floating-point DAC preferably applied to digital audio apparatuses such as compact disk players.

2. Prior Art

A floating-point DAC that converts digital data represented by 2's complement of 22-bits into an analog signal is constructed as shown in FIG. 1 (though FIG. 1 is a block diagram of an embodiment of the invention, it is also used here to illustrate the conventional apparatus). In FIG. 1, 1a designates a shift processor comprising input buffers all designated as 2, 2, ..., a shift-number-detection circuit 3a, a digital-shift circuit 4, and an inverter 5. Digital input data of 22-bits $I_0$ to $I_{21}$ is applied to the digital-shift circuit 4 through the input buffers 2, 2, ... The upper 7-bits $I_{15}$ to $I_{21}$ of the 22-bits, forming the exponent thereof, are supplied to the shift-number-detection circuit 3a which produces shift numbers $S_0$ to $S_6$ according to the exponent. The digital-shift circuit 4 produces 15-bit digital mantissa $M_0$ to $M_{14}$ by shifting the input data $I_0$ to $I_{20}$ by bit positions specified by one of the shift numbers $S_0$ to $S_6$. The inverter 5 inverts the most significant bit $I_{21}$ of the input data and produces the reversed bit as the most significant bit $M_{15}$ of the digital mantissa.

Numeral 6 designates a mantissa DAC 6 that converts the digital mantissa $M_0$ to $M_{15}$ to an analog mantissa. It comprises a buffer circuit 7 and R-2R ladder network 8. The buffer circuit 7 is provided with a pair of serially connected inverters for each bit which produces high or low voltage according to logic-1 or logic-0 of each bit of the digital mantissa $M_0$ to $M_{15}$. The R-2R ladder network 8 receives each bit of the digital mantissa, multiplies each bit by a specific weight, and sums the resulting products, thus producing an analog mantissa.

Numeral 9 designates an exponent DAC which produces analog output $V_{OUT}$ that corresponds to the input data $I_0$ to $I_{21}$, using the analog mantissa applied from the mantissa DAC 6 and the shift numbers $S_0$ to $S_6$ supplied from the shift-number-detection circuit 3a. It comprises a R-2R ladder network 10 and a switch circuit 11. The R-2R ladder network 10 multiplies the analog mantissa by weight specified by one of the shift numbers $S_0$ to $S_6$ and the reference voltage $V_{MP}$. The switch circuit 11 consists of 7 switch elements, one of which turns on according to one of shift numbers $S_0$ to $S_6$ of logic-1.

In the construction mentioned above, the shift-number-detection circuit 3a determines the shift numbers $S_0$ to $S_6$, as shown in FIG. 2(a) and (b). Analog levels represented by digital notation as from +2097151 to −2097152 in FIG. 2(a), are divided into $2^4(=16)$ levels by every 6 dB interval, and the shift numbers $S_0$ to $S_6$ are determined as shown in FIG. 2(b). Specifically, when the absolute value of the analog level ranges from the maximum to $\frac{1}{2}$ thereof, the shift number $S_0$ is assigned; from $\frac{1}{2}$ to $\frac{1}{4}$, the shift number $S_1$ is assigned; from $\frac{1}{4}$ to $\frac{1}{8}$, the shift number $S_2$ is assigned, and so on. Each digital mantissa $M_0$ to $M_{14}$ is selected from the input data $I_0$ to $I_{20}$ according to the shift numbers $S_0$ to $S_6$ as shown in FIG. 2(a): solid arrows (←→) in the input data table shown in FIG. 2(a) designate the range to be selected as a digital mantissa $M_0$ to $M_{14}$. Inspection of FIG. 2(a) shows that every time the analog level is halved, shift numbers $S_0$ to $S_6$ are changed, as well as the input data $I_0$ to $I_{20}$ to be selected as a mantissa is shifted. Furthermore, mantissa $M_{15}$ is obtained as a reversed value of the input data $I_{21}$.

FIG. 3(a) depicts the relationships between analog levels and the shift numbers $S_0$ to $S_6$. Each time the amplitude of the analog signal is halved (i.e., every 6 dB interval), one of the shift numbers $S_0$ to $S_6$ is selected in turn and assigned to each level, beginning with the maximum level to $\frac{1}{2}$ thereof, shift number $S_0$ is assigned, from $\frac{1}{2}$ to $\frac{1}{4}$, shift number $S_1$, and so on. If two levels corresponding to the shift numbers $S_0$ and $S_1$ are compared, although the output of mantissa DAC 6 has the same range in both cases, the output of the exponent DAC 9 is half the level corresponding to the shift number $S_1$ as in the shift number $S_0$.

If both the mantissa DAC 6 and exponent DAC 9 had 16-bit accuracy (i.e., $(100 * 2^{-16})\%$), the relationship between the analog output level of the sinusoidal wave and the total harmonic distortion (called "distortion" for brevity hereafter) of the analog output level measured by a distortion meter, would be shown by solid line A in FIG. 4. First, line A shows saw-tooth variation, because every time the shift number is incremented by 1 the amplitude of the mantissa increases by 6 dB over that just immediately prior to the shift, and thus distortion decreases by 6 dB each time the shift number is changed. Second, the average level of the line A is kept constant. This is because error E applied from the mantissa DAC 6 to the input terminal of the R-2R ladder network 10 of the exponent DAC 9 is halved each time the shift number changes from $S_0$ to $S_6$, such as $2^{-1} \cdot E$, $2^{-2} \cdot E$, ..., $2^{-6} \cdot E$, and hence error E and the level of analog output are simultaneously halved. Thus, average distortion of the analog signal is kept constant as long as the shift number is changed. Consequently, distortion of the analog signal varies between two levels (between 0.00125% and 0.0025%, for example) in the range from 0 to 36 dB in which the shift number is altered, whereas distortion in the smaller range is inversely proportional to the level of analog output $V_{OUT}$ because the shift number is not changed.

As described above, if both mantissa DAC 6 and exponent DAC 9 have 16-bit accuracy, a low level distortion is obtained as shown by solid line A in FIG. 4. In practice, however, a low level distortion cannot be achieved because 16-bit accuracy of exponent DAC 9 cannot be obtained. More specifically, though 14-bit to 16-bit accuracy can be achieved for the mantissa DAC 6 by trimming or other means to compensate for errors of each resistor in the R-2R ladder network 8, it is very difficult to obtain similar accuracy for exponent DAC 9. This is because the resistor of ladder network 10 in exponent DAC 9 are connected to form an integral part, and so each resistance there of cannot be measured separately and hence the trimming thereof is difficult. In particular, it is very difficult to achieve high accuracy in a range where the level of analog output is small. Consequently, sufficient adjustment of resistors in the exponent DAC 9 is practically impossible, so the actual accuracy obtained is about 10- to 12-bits.

For this reason, even if mantissa DAC 6 of 16-bit accuracy is employed, the accuracy of the resulting output from exponent DAC 9 is only about 10- to 12-bits, as shown by broken line B in FIG. 4. First, the distortion in this case shows saw-tooth variation, because every time the shift number is incremented by one, the weight of exponent DAC 9 is decreased by 6 dB while the amplitude of the mantissa increases by 6 dB over that just immediately prior to the shift, and thus distortion decreases significantly from 10- to 12-bit accuracy. Second, the distortion is improved to 0.00125% abruptly at −36 dB because the shift number $S_6$ which is used thereunder is free from the low accuracy of exponent DAC 9.

The fact that distortion increases near the maximum output (0 dB), causes a critical problem in digital audio apparatus such as compact disk players, because performance of these apparatus is specified by distortion at 0 dB output.

SUMMARY OF THE INVENTION

It is therefore an object of the invention to provide a floating-point digital-to-analog converting system which has improved distortion characteristic of maximum output level, by using the exponent DAC that has a similar accuracy to that of a conventional one, thus achieving a higher dynamic range.

According to one aspect of the present invention, there is provided a floating-point digital-to-analog converting system comprising:

shifting means for detecting shift numbers according to exponent data of floating point digital input data, and for shifting the input data according to the shift numbers to produce digital mantissa data of the input data;

mantissa converting means for converting the digital mantissa data to an analog mantissa; and exponent converting means for converting the shift numbers to weights represented by the exponent data and a certain base, and for multiplying the analog mantissa by one of the weights;

whereby the shifting means shifts the input data when the absolute value of the analog mantissa is less than the value at which the accuracy of the mantissa converting means becomes lower than that of the exponent converting means; and the exponent converting means multiplies the analog mantissa by the weight other than 1 only so long as the accuracy of the mantissa converting means is lower than that of the exponent converting means.

BRIEF DESCRIPTION OF THE DRAWINGS

FIG. 2 is a table showing the relationship between digital input data $I_0$ to $I_{21}$ and shift number $S_0$ to $S_6$ of the embodiment, in comparison with a conventional apparatus;

DESCRIPTION OF THE PREFERRED EMBODIMENTS

The invention will now be described with reference to the accompanying drawings.

[A] First Embodiment

Figure 1:
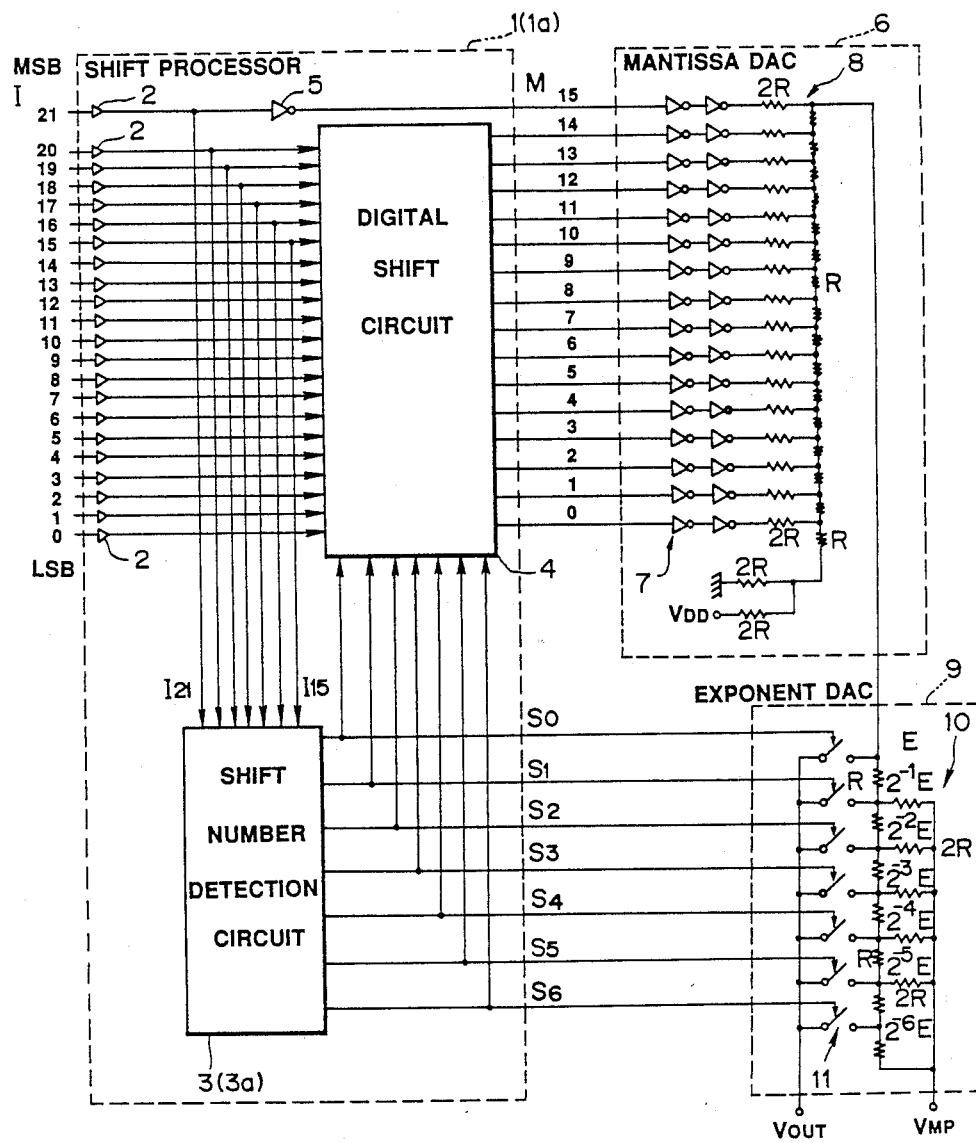
FIG. 1 is a block diagram of a floating-point DAC according to an embodiment of the present invention.

FIG. 1 is a block diagram of a floating-point DAC according to a first embodiment of the present invention.

This embodiment differs from the conventional apparatus in the construction of shift-number-detection circuit 3. The shift-number-detection circuit 3 that constitutes a shift processor 1 does not initiate its shift operation of the input data $I_0$ to $I_{20}$ as long as the accuracy of mantissa DAC 6 is higher than that of exponent DAC 9.

Figure 4:
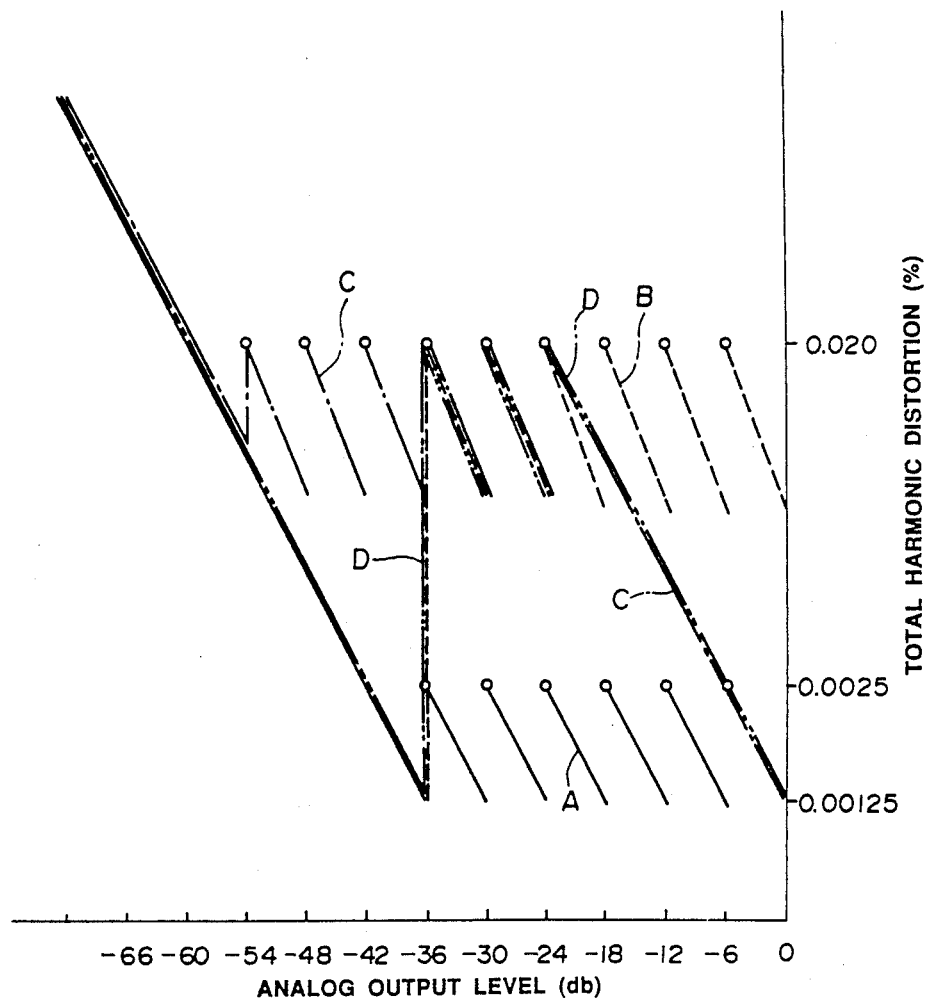
FIG. 4 is a graph showing the relationship between the analog output level and the total distortion thereof, in comparison to a conventional apparatus.

Specifically, consider the output distortion of 16-bit mantissa DAC 6. For example, when the analog output signal thereof is maximum, i.e., 0 dB, its distortion is 0.00125%. The distortion increases inversely proportional to the analog output level and reaches 0.02% at the −24 dB level as shown in FIG. 4 by alternate-long-short-dash line C. This value of distortion is comparable to that of the exponent DAC 9 of about 12-bit accuracy. For this reason, the shift processor 1 does not change the shift number $S_0$ as long as the accuracy of the mantissa DAC 6 is greater than that of exponent DAC 9, i.e., as long as the level of the analog mantissa is in the range of 0 to −24 dB, so that mantissa DAC 6 can make its accuracy to its full extent.

Figure 2:
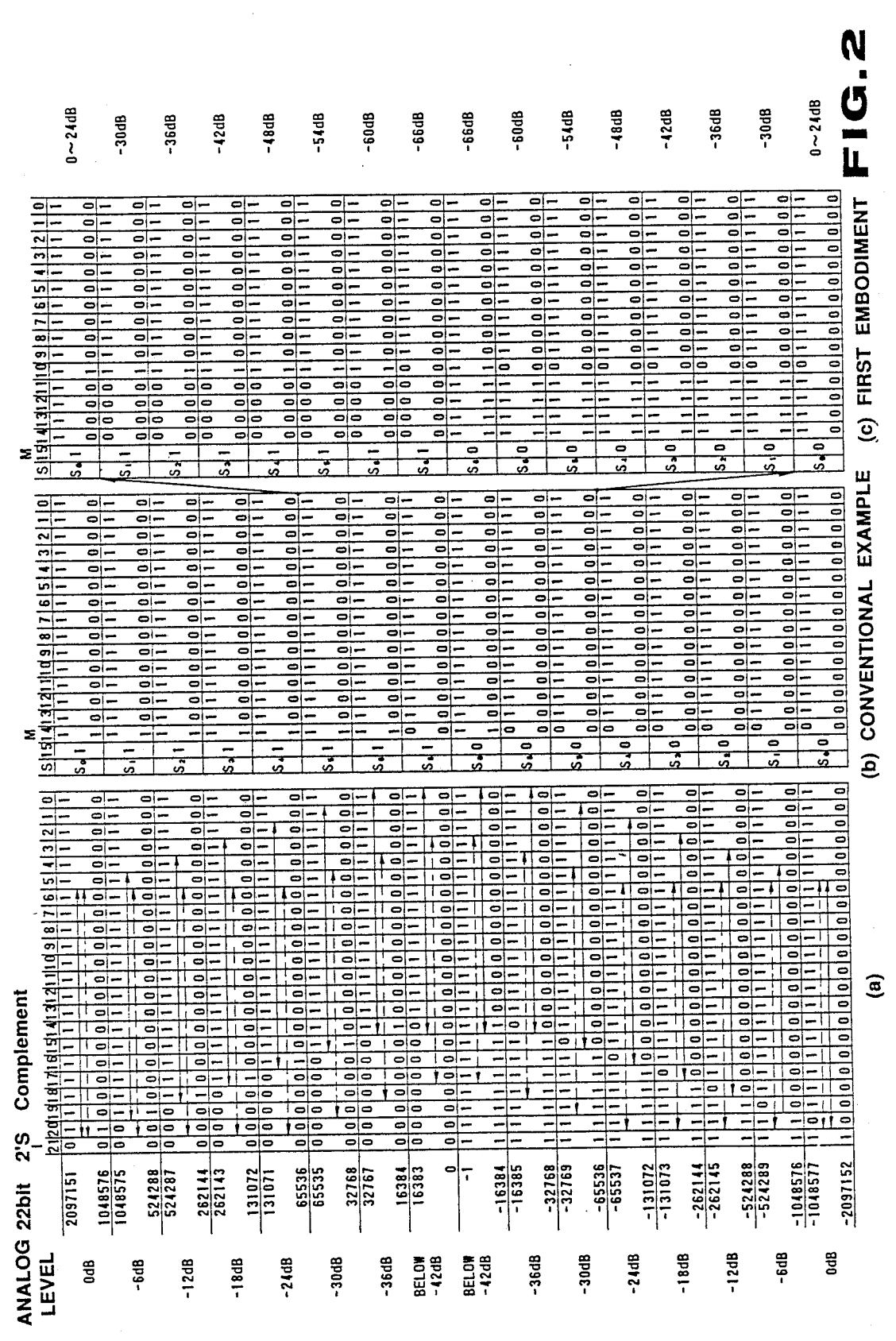
Figure 3:
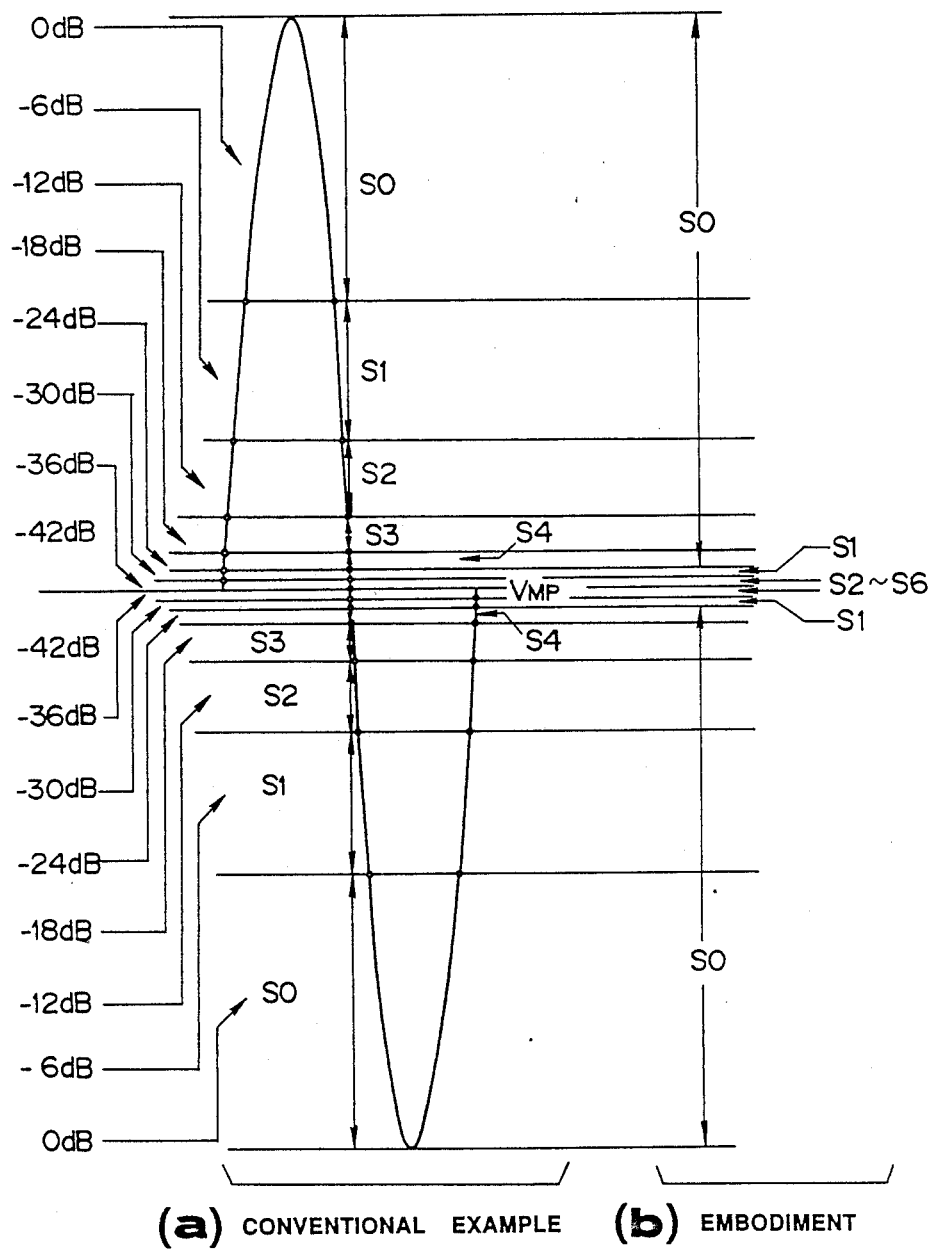
FIG. 3 is a graph showing the relationship between the analog output level and the shift number of the embodiment, in comparison with a conventional apparatus.

FIG. 2(c) and FIG. 3(b) show changing points of shift numbers $S_0$ to $S_6$ according to the embodiment. As long as the analog level is larger than −24 dB, the shift number is kept $S_0$, i.e., the shift in exponent DAC 9 is not performed. In contrast, when the analog level is reduced to −24 dB, or to −30 dB, or to −36 dB, ... in 6 dB increments, the shift numbers are changed to $S_1$, $S_2$, $S_3$, ..., respectively. Bits $M_0$ to $M_{14}$ of the digital mantissas selected from the input data $I_0$ to $I_{20}$ and produced from the digital-shift circuit 4 for each of shift numbers are designated by broken arrows (←- - -→) in FIG. 2(a).

According to the construction described above, distortion near the maximum output level (0 dB) is lessened as shown in FIG. 4 by alternate-long-short-dash line C, when using exponent DAC 9 of the conventional accuracy, thus achieving a wide dynamic range.

[B] Second Embodiment

The second embodiment of the present invention is designed so that distortion characteristic thereof will be as shown in FIG. 4 by alternate-long-and-two-short-dashes line D. In other words, the shift processor 1 of the second embodiment increments shift numbers by one each time the input data decreases by 6 dB, as far as the shifting quantity decreases to −36 dB, i.e., −6 dB * $S_6$, after the shift processor 1 initiates the shifting of the input data at −24 dB. Simultaneously, it selects bits $M_0$ to $M_{14}$ of mantissas as shown in FIG. 2(a) by solid arrows in the range below −36 dB. Consequently, the distortion level of the second embodiment will be a combination of the lowest levels of distortion in FIG. 4 shown by the alternate-long-short-dash line C of the first embodiment, and by the broken line B showing the conventional distortion level.

Although specific embodiments of a floating-point digital-to-analog converter constructed in accordance with the present invention have been disclosed, it is not intended that the invention be restricted to either these specific configurations or to the uses disclosed herein. Modifications may be made in a manner obvious to those skilled in the art. For example, the invention also applies to a floating-point DAC designed such that analog output of the exponent DAC is inputted to the analog input terminal of mantissa DAC which produces analog output corresponding to digital input data. Accordingly, it is intended that the invention be limited only by the scope of the appended claims.

What is claimed is:

1. A floating-point digital-to-analog converting system comprising:
   (a) a detecting means for detecting bit-shift numbers in response to digital exponent data included in floating point digital input data;
   (b) shifting means for shifting said digital input data in accordance with detected bit-shift numbers to thereby produce digital mantissa data;
   (c) mantissa converting means for converting said digital mantissa data into an analog mantissa; and
   (d) exponent converting means for carrying out an exponent digital-to-analog conversion to produce an analog output by multiplying said analog mantissa by weights corresponding to said shift numbers, said analog mantissa being output as said analog output when an accuracy of said mantissa converting means is higher than that of said exponent converting means, while said shifting means and said exponent converting means are activated so that said exponent converting means multiplies said analog mantissa by said weights each having a value other than "1" when an absolute value of said analog mantissa is less than a predetermined value representing that accuracy of said mantissa converting means is lower than that of said exponent converting means.

2. A floating-point digital-to-analog converting system according to claim 1, wherein said shifting means increments each of said shift numbers by "1" every time a level of said digital input data is decreased by 6 dB after said shifting means initializes its bit-shift operation used on said digital input data.

3. A floating-point digital-to-analog converting system according to claim 1, wherein after initializing a bit-shift operation, said shifting means increments each of said shift numbers by "1" every time the level of said digital input data is decreased by 6 dB until a shifting quantity decreases to a point specified by a maximum shift number multiplied by 6 dB, said exponent converting means multiplying said analog mantissa by a maximum weight when a level of said digital input data becomes lower than said point.

* * * * *